US009741953B2

(12) United States Patent
Benwadih

(10) Patent No.: US 9,741,953 B2
(45) Date of Patent: Aug. 22, 2017

(54) ORGANIC FIELD-EFFECT TRANSISTOR

(71) Applicant: Commissariat A L'Energie Atomique Et Aux Energies Alternatives, Paris (FR)

(72) Inventor: Mohammed Benwadih, Champigny sur Marne (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 34 days.

(21) Appl. No.: 14/178,805

(22) Filed: Feb. 12, 2014

(65) Prior Publication Data
US 2014/0183507 A1  Jul. 3, 2014

Related U.S. Application Data

(63) Continuation of application No. PCT/FR2012/051301, filed on Jun. 11, 2012.

(30) Foreign Application Priority Data

Sep. 14, 2011  (FR) ...................... 11 58178

(51) Int. Cl.
*H01L 51/05* (2006.01)
*H01L 51/00* (2006.01)

(52) U.S. Cl.
CPC ...... *H01L 51/0512* (2013.01); *H01L 51/0541* (2013.01); *H01L 51/0558* (2013.01); *H01L 51/0097* (2013.01)

(58) Field of Classification Search
CPC ............. H01L 51/0512; H01L 51/0558; H01L 51/0541; H01L 51/0097

(Continued)

(56) References Cited

U.S. PATENT DOCUMENTS 5,607,631 A * 3/1997 Wolfson ............. H01P 1/181
264/138
6,387,818 B1 * 5/2002 Lopatin ............. H01L 21/31144
257/E21.257

(Continued)

FOREIGN PATENT DOCUMENTS

FR  2 870 989 A1  12/2005
JP  05-326402 A1  12/1993

(Continued)

OTHER PUBLICATIONS

Damien Boudinet, et al., "*Influence of Substrate Surface Chemistry on the Performance of Top-Gate Organic Thin-Film Transistors*," Journal of the American Chemical Society, vol. 133, Issue 26, 2011, pp. 9968-9971.

(Continued)

*Primary Examiner* — Michele Fan
(74) *Attorney, Agent, or Firm* — Burr & Brown, PLLC

(57) ABSTRACT

An organic transistor including at least one lower substrate made of plastic material, two electrodes, respectively a source electrode and a drain electrode, deposited on the plastic substrate, a semiconductor layer made of an organic semiconductor material and deposited on the electrodes and the plastic substrate, a dielectric layer deposited on the semiconductor layer, and a gate electrode formed on said dielectric layer. It further includes a porous layer extending between the plastic substrate and the semiconductor layer, said porous layer extending at least between the source and drain electrodes, to decrease the dielectric constant of the surface of said plastic substrate.

9 Claims, 3 Drawing Sheets

(58) Field of Classification Search
USPC ............ 257/40, E51.001, E51.004–E51.006; 438/99
See application file for complete search history.

(56) References Cited

U.S. PATENT DOCUMENTS

| | | | |
|---|---|---|---|
| 2003/0129379 A1* | 7/2003 | Yao .................... | B29C 41/12 428/308.4 |
| 2004/0101626 A1* | 5/2004 | Kanada et al. ............ | 427/385.5 |
| 2004/0159557 A1* | 8/2004 | Sato .................... | C09G 1/02 205/682 |
| 2004/0212042 A1* | 10/2004 | Sagisaka ................ | C08G 61/12 257/552 |
| 2006/0102937 A1* | 5/2006 | Maruyama et al. .......... | 257/275 |
| 2008/0032139 A1 | 2/2008 | Le Blevennec et al. | |
| 2010/0038630 A1* | 2/2010 | Marks .................... | C08K 5/18 257/40 |
| 2010/0220274 A1* | 9/2010 | Nakayama et al. .......... | 349/123 |
| 2010/0291411 A1* | 11/2010 | Kawakami et al. .......... | 428/815 |
| 2010/0295042 A1* | 11/2010 | Yano et al. ............... | 257/43 |
| 2011/0037064 A1* | 2/2011 | Mueller et al. ............ | 257/40 |
| 2011/0117695 A1* | 5/2011 | Cheng ................ | H01L 51/0004 438/99 |
| 2011/0186829 A1* | 8/2011 | Burroughes et al. .......... | 257/40 |
| 2011/0260249 A1* | 10/2011 | Nakamura ................. | 257/347 |
| 2013/0020117 A1* | 1/2013 | Yamato ................... | 174/258 |

FOREIGN PATENT DOCUMENTS

| | | | |
|---|---|---|---|
| JP | 2002-203861 A1 | | 7/2002 |
| KR | 20090103240 A | * | 10/2009 |
| WO | WO 2005040460 A1 | * | 5/2005 |
| WO | 2009/105045 A1 | | 8/2009 |
| WO | WO 2011074418 A1 | * | 6/2011 |

OTHER PUBLICATIONS

International Search Report dated Oct. 15, 2012.

* cited by examiner

ORGANIC FIELD-EFFECT TRANSISTOR

TECHNICAL DOMAIN

The present invention relates to the field of organic transistors, such as, for example, organic thin-film transistors (OTFT), and more specifically to an organic transistor comprising means enabling to decrease the dielectric constant of the surface of the plastic substrate.

BACKGROUND

FIG. 1 shows an organic thin-film transistor (OTFT) 1 of prior art, having a so-called "high-gate" and "low-contact" structure. Transistor 1 comprises a lower substrate 2, having two electrodes 3, 4, respectively a source electrode 3 and a drain electrode 4, formed thereon. A semiconductor layer 5 is deposited on lower substrate 2, and on source and drain electrodes 3 and 4. Finally, a dielectric layer 6 is deposited on semiconductor layer 5, and has a gate electrode 7 formed thereon.

The transistor effect is obtained, as known per se, by applying a voltage between gate electrode 7 and lower substrate 2, to create, in semiconductor layer 5, a conduction channel between source electrode 3 and drain electrode 4.

However, the performance of such organic transistors strongly depends on the chemical characteristics of the interfaces between semiconductor layer 5, dielectric layer 6, and source and drain electrodes 3 and 4.

Indeed, the electric permittivity of the flexible substrates, forming lower substrate 2, such as polyethylene naphthalate (PEN), is generally greater than 3 (approximately 3.5), thus generating an electric stress in semiconductor layer 5 and/or creating a trapping of charges at the lower substrate/semiconductor layer interface (also called leakage path), which strongly disturbs the performance of such "high gate" organic transistors.

Flexible polyethylene naphthalate (PEN) substrates have at their surface a high concentration of dipoles (acid COOH group, polar OH$^-$ group, fluorinated group) which are electrically non-neutral (positive or negative charges) and which strongly alter the electric conduction in semiconductor layer 5 of such organic transistors.

To overcome the problems of interface and of high permittivity of lower substrate 2, it is known to deposit a self-assembled monolayer SAM between lower substrate 2 and semiconductor layer 5 and source and drain electrodes 3 and 4, and this, to limit the influence of substrate 2.

Such an organic field-effect transistor structure is particularly described in publication "*Influence of Substrate Surface Chemistry on the Performance of Top-Gate Organic Thin-Film Transistors*"; Boudinet D, Benwadih M, Altazin S, Verilhac J M, De Vito E, Serbutoviez C, Horowitz G, Facchetti A; J Am CHEM SOC, 2011 Jul. 6; 133 "26"; 9968-9971, EPUB 2011 Jun. 10, PMID; 21661723 [pubmed].

FIG. 2, which also describes a prior art field-effect transistor, shows the structure of the transistor of FIG. 1, further comprising a self-assembled monolayer 8 positioned between lower substrate 2 and semiconductor layer 5 and source and drain electrodes 3 and 4.

Several trials have been carried out with a semiconductor layer 5, referring to FIG. 4, made of a derivative of N,N'-dialkylsubstituted-(1,7&1,6)-dicyanoperylene-3,4:9,10-bis (dicarboximide) (n-channel), sold under trade name Activink N1400 by POLYERA, or of poly[bis(4-phenyl)(2,4,6-trimethylphenyl)amine] called poly(triaryl amine) or PTAA (P-channel) and several self-assembled monolayers (SAM), referring to FIG. 3, comprising alkyl/phenyl-amino (examples 1 et 2), alkyl (examples 3 et 4) and halo-alkyl (examples 5 et 6) functional groups.

As can be seen in FIGS. 5A and 5B, the electric performance of such organic transistors is altered or shifts whatever the nature of semiconductor layer 5 and/or the nature of self-assembled monolayer (SAM) 8.

SUMMARY OF THE INVENTION

One of the aims of the invention thus is to overcome such disadvantages by providing an OTFT-type organic field-effect transistor of simple design, low cost, and limiting the performance alteration of such organic transistors.

For this purpose, the invention provides an organic transistor comprising at least one lower substrate made of plastic material, called plastic substrate, two electrodes, respectively a source electrode and a drain electrode, deposited above the plastic substrate, a semiconductor layer made of an organic semiconductor material and deposited on top of and in contact with the electrodes and the plastic substrate, a dielectric layer made of a dielectric material and deposited on the semiconductor layer, and a gate electrode formed on the dielectric layer.

This organic transistor further comprises a layer made of a porous dielectric material, extending between the plastic substrate and the semiconductor layer, the porous layer extending at least under the conduction channel, that is, between the source and drain electrodes, to decrease the dielectric constant of the surface of the plastic substrate.

The deposition of this porous layer between the lower substrate and the semiconductor layer and the source and drain electrodes enables to significantly decrease the permittivity, that is, the dielectric constant between the plastic substrate and the semiconductor layer, which enables, on the one hand, to avoid the occurrence of electric stress and, on the other hand, to maintain a good performance of the organic transistor.

Preferably, the pores of the porous layer have a diameter smaller than 50 nanometers.

The end groups of the porous layer are advantageously non-polar and the semiconductor layer has a low roughness.

Preferably, the porous layer has a permittivity lower than 2.5.

Further, the porous layer is obtained from acrylate monomer and/or at least one derivative thereof, from polystyrene, polyvinylphenol, or mixtures thereof.

It may be obtained by photocrosslinking of methyl methacrylate through a photo-lithographic etch mask.

It may also be obtained from silane, or may be formed of porous silica.

It may further be made of porous alumina obtained by a sol-gel method.

BRIEF DESCRIPTION OF THE DRAWINGS

The foregoing and other features and advantages will be discussed in detail in the following non-limiting description of specific embodiments of the organic field-effect transistor according to the invention, in connection with the accompanying drawings, among which.

DETAILED DESCRIPTION OF THE INVENTION

Figure 1:
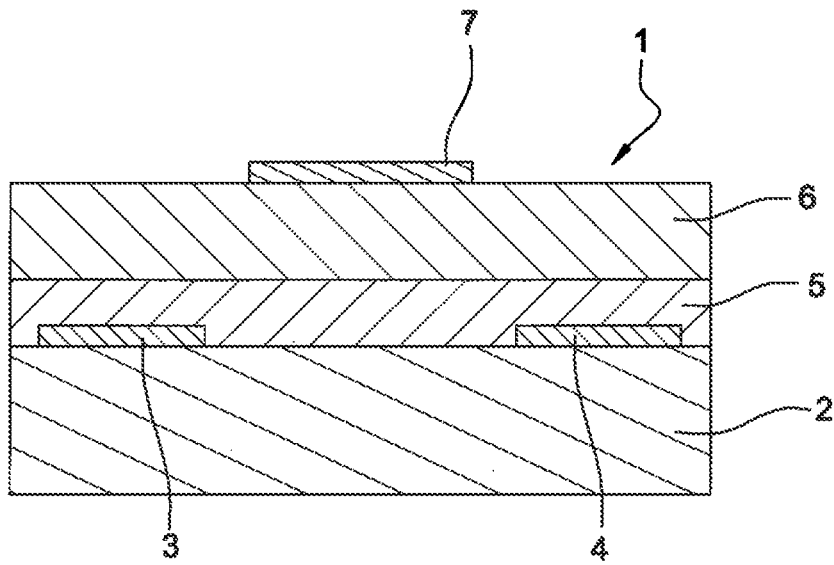
FIG. 1 is a simplified cross-section view of an OTFT-type "high gate" and "low contact" organic transistor of prior art.
Figure 2:
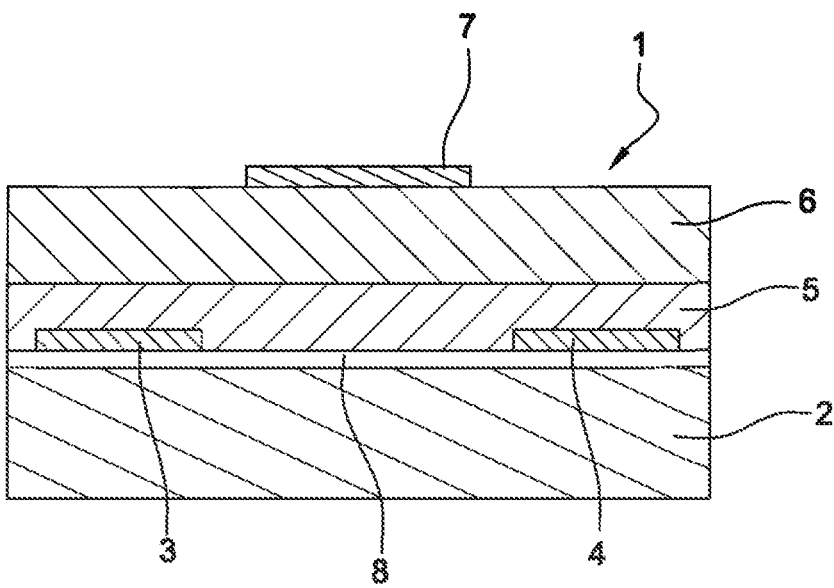
FIG. 2 is a simplified cross-section view of an OTFT-type "high gate" and "low contact" organic transistor comprising a self-assembled monolayer (SAM) of prior art.
Figure 3:
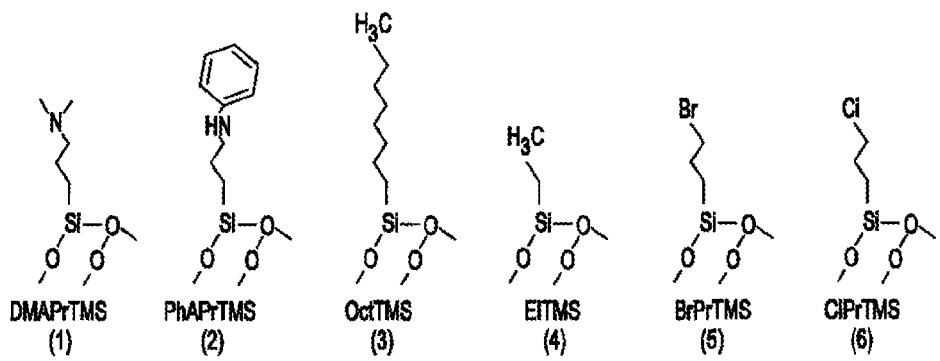
FIG. 3 is a simplified representation of the molecules from which the self-assembled monolayer (SAM) of prior art organic transistors is obtained.
Figure 4:
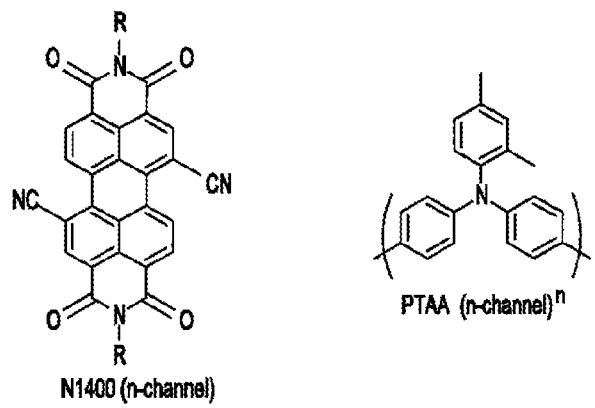
FIG. 4 is a simplified representation of the different molecules from which the semiconductor layer of prior art organic transistors is obtained.
Figure 5A:
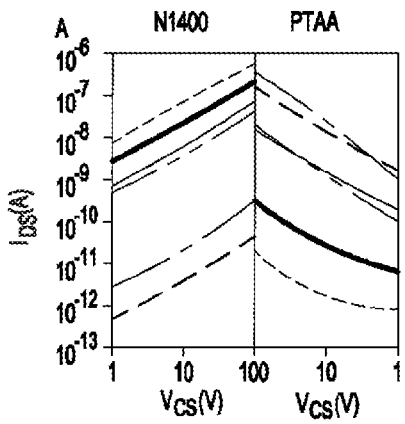
FIGS. 5A and 5B are curves showing the intensity of the current between the drain and the source according, on the one hand, to the voltage between the drain and the source and, on the other hand, to the voltage between the gate and the source of prior art organic field-effect transistors.
Figure 5B:
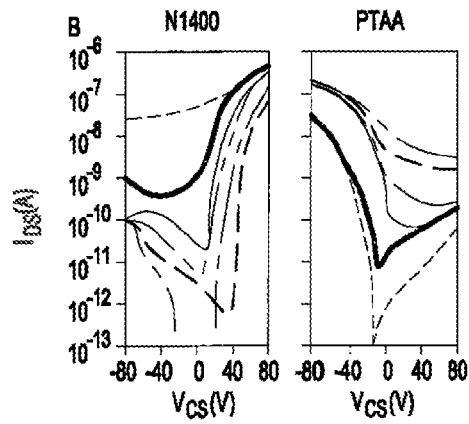

For clarity, in the following description, the same elements have been designated with the same reference numerals in the different drawings. Further, the various cross-section views are not necessarily drawn to scale.

Figure 6:
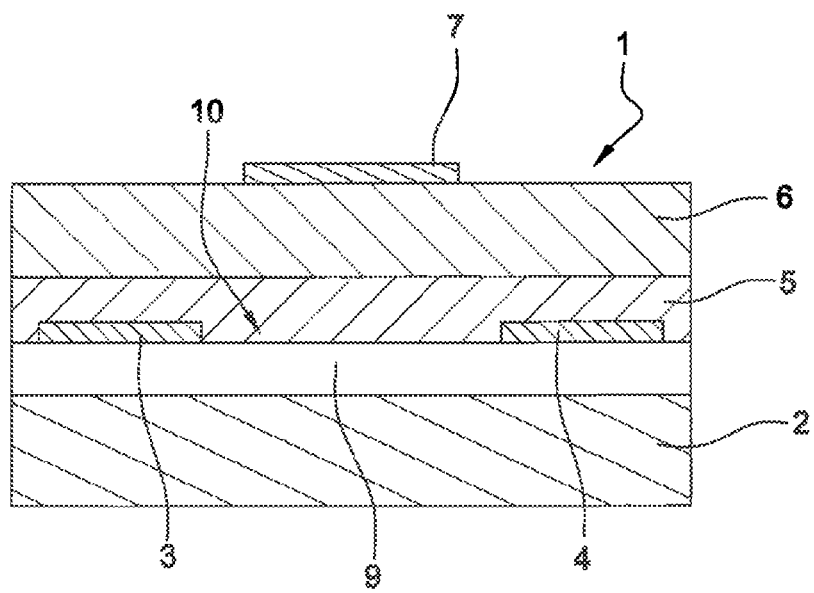
FIG. 6 is a simplified cross-section view of an OTFT organic field-effect transistor according to the invention.

Referring to FIG. 6, OTFT-type transistor 1 according to the invention comprises a lower substrate made of a plastic material, called plastic substrate 2, having a porous layer 9 made of a porous material deposited on its upper surface.

The plastic substrate 2 is made of a plastic material selected from the following list: polymers such as polyethylene terephthalate (PET), polyethylene naphthalate (PEN), polyimide (PI), etc. or any other plastic material well known by those skilled in the art.

Porous layer 9 is made of a dielectric material having a permittivity lower than 2.5, a stable chemical structure comprising neutral groups with no polar dipoles, that is, a non-polar structure. Thus, the porous layer 9 is electrically neutral, since it comprises no electron donor or electropositive groups.

Further, the pores of porous layer 9 preferably have a diameter smaller than 50 nanometers. What matters is to obtain a final or end surface of the semiconductor layer having a low roughness (Ra≤15 nanometers). The pore size is thus selected according to the thickness of the semiconductor layer: indeed, it is well known that the thicker the layer, the less its end surface reflects the roughness of its initial support.

For example, for a 140-nm thickness of the semiconductor layer, a pore diameter smaller than or equal to 50 nanometers is accepted.

Similarly, for a 80-nm thickness of the semiconductor layer, a pore diameter smaller than or equal to 20 nanometers is accepted.

Finally, for a 50-nm thickness of the semiconductor layer, a pore diameter smaller than or equal to 10 nanometers is accepted.

Preferably, porous layer 9 is obtained from acrylate monomer and/or at least one derivative thereof, and preferably by photocrosslinking of methyl methacrylate through a photolithography mask and/or from silane and/or from porous silica and/or from porous alumina obtained by a sol-gel method and/or any other appropriate material known by those skilled in the art. Other methods such as emulsion, demixing, or a direct deposition through a mask may also be implemented.

Porous layer 9 may be deposited on plastic substrate 2 by any method well known by those skilled in the art, such as spin coating, spreading, silk-screening, or printing, for example, or even photogravure, flexogravure, or also inkjet.

The transistor further comprises two electrodes 3, 4, a source electrode 3 and a drain electrode 4, deposited on porous layer 9. A semiconductor layer 5 is deposited on porous layer 9, source electrode 3, and drain electrode 4. A dielectric layer 6 is deposited on semiconductor layer 5. Eventually, a gate electrode 7 is deposited on the dielectric layer 6.

Source and drain electrodes 3 and 4 are for example made of a metal, such as aluminum, titanium, nickel, gold, chromium, etc. . . . , or of metal particles, of metal oxides such as indium-tin oxide, indium-zinc oxide, etc. . . . , or even of conductive polymers such as 3,4-polyethylene dioxythiophene-polystyrene, sulfonate (PEDOT:PSS), polyaniline, etc. . . . , doped silicon materials or of any other appropriate conductive material well known by those skilled in the art.

Semiconductor layer 5 is for example formed of an organic semiconductor layer made of a material selected from the following list: semiconductor organic molecules such as tetracene, pentacene, phthalocyanine, semiconductor polymers such as polythiophene, polyfluorene, polyphenylene vinylene or derivatives thereof such as poly (3-octyl), thiophene, poly [2-methoxy-5-(2'-ethyl-hexyloxy)-1,4-], phenylene, vinylene or oligomer such as α-sexithiophenes.

However, semiconductor layer 5 may also be made of a semiconductor inorganic material well known by those skilled in the art such as silicon or gallium arsenide (GaAs) or also ZnO, for example, without departing from the context of the invention.

Dielectric layer 6 is made of a material for example selected from the following list: silicon dioxide, silicon nitrate, titanium dioxide, aluminum oxide, hafnium dioxide, polyimides, polyvinyl, pyrrolidone, polymethylmethacrylate, polyamide, parylene, polystyrene, fluoropolymers, or of any dielectric material well known by those skilled in the art.

The deposition of porous layer 9 between lower substrate 2 and semiconductor layer 5 and source and drain electrodes 3 and 4 significantly decreases the permittivity, that is, the dielectric constant between plastic substrate 2 and semiconductor layer 5. This enables the organic transistor to avoid the occurrence of electric stress and of a charge trapping, and maintains a good performance of the organic transistor.

For example, the deposition of a porous methyl methacrylate layer 9 deposited by photocrosslinking through a mask on a plastic layer 2 made of polyethylene naphthalate (PEN) decreases the permittivity of polyethylene naphthalate (PEN), which is normally from 3 to 1.5.

It should be noted that, in this specific embodiment, porous layer 9 is deposited full plate on plastic substrate 2, that is, it covers the entire upper surface of the plastic substrate 2. However, it is possible to only deposit the porous layer 9 under conduction channel 10 of semiconductor layer 5 extending between source and drain electrodes 3 and 4, without departing from the field of the invention.

Figure 7:
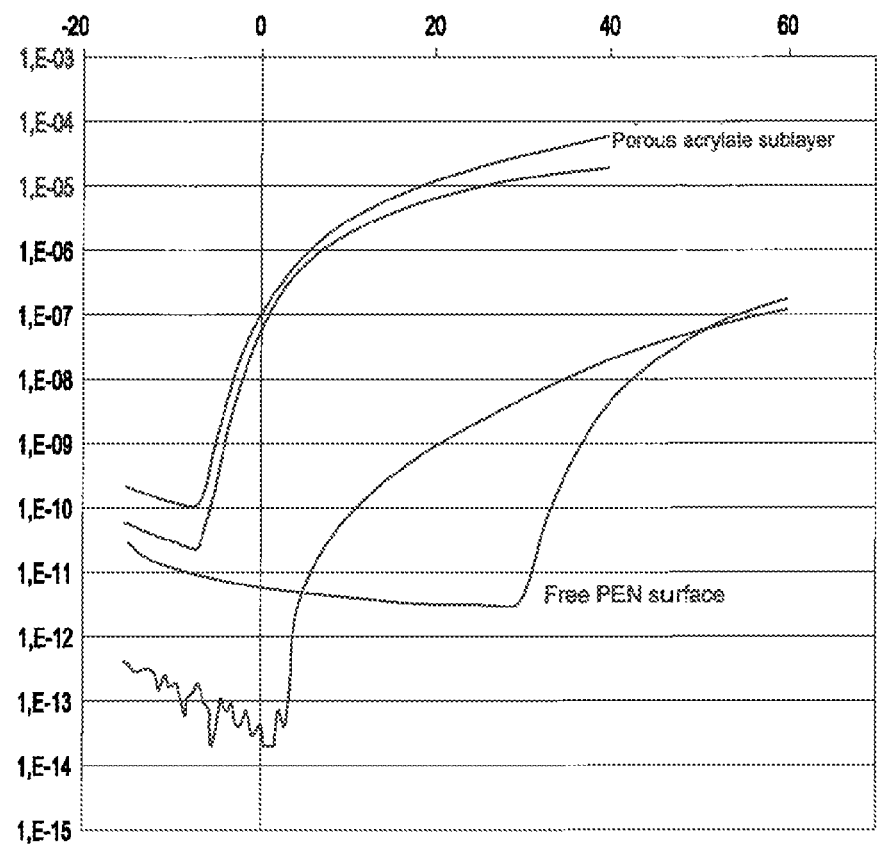
FIG. 7 is a curve showing the intensity of the current measured between the drain and the source, on the one hand, for an organic field-effect transistor comprising a porous layer according to the invention and, on the other hand, for an organic field-effect transistor of prior art comprising no porous layer.

As can be seen in FIG. 7, which is a curve showing the intensity of the current measured between the drain and the source according to the voltage between the gate and the source, on the one hand, for an organic field-effect transistor comprising a porous layer 9 according to the invention and, on the other hand, for an organic field-effect transistor of prior art comprising no porous layer 9, the porous layer of the transistor according to the invention preserves the performance of the transistor, conversely to prior art transistors. Indeed, in prior art field-effect transistors, the surface of plastic substrate 2 made of polyethylene naphthalate (PEN) attracts electrons and the different types of dipoles present on the surface of plastic substrate 2 strongly shift the transistor curves in the two modes, that is, the linear mode and the saturated mode, unlike what happens for the transistor according to the invention, for which the curves of the two states are neither shifted, nor altered.

The invention claimed is:

1. An organic transistor comprising at least one lower plastic substrate made of a plastic material, a source electrode and a drain electrode respectively disposed above the plastic substrate, a semiconductor layer made of an organic semiconductor material and disposed on top of and in contact with both the source and drain electrodes and disposed above the plastic substrate, a dielectric layer made of a dielectric material and disposed on the semiconductor layer, a gate electrode disposed on the dielectric layer, and a porous layer made of a dielectric material disposed between and contacting both the plastic substrate and the semiconductor layer, the porous layer extending only under a conduction channel of the semiconductor layer and between the source and drain electrodes, to decrease the dielectric constant of the surface of the plastic substrate, wherein the porous layer has a permittivity lower than 3, and wherein the semiconductor layer has a final top surface extending above the source electrode, the drain electrode and an entirety of the porous layer, and the final top surface has a roughness smaller than or equal to 15 nanometers.

2. The organic transistor of claim 1, wherein the pores of the porous layer have a diameter smaller than 50 nanometers.

3. The organic transistor of claim 1, wherein end groups of the porous layer are non-polar.

4. The organic transistor of claim 1, wherein the porous layer has a permittivity lower than 2.5.

5. The organic transistor of claim 1, wherein the porous layer is obtained from acrylate monomer and/or at least one derivative thereof, or from polystyrene, from polyvinylphenol, or from mixtures thereof.

6. The organic transistor of claim 5, wherein the porous layer is obtained by photocrosslinking of methyl methacrylate through a mask.

7. The organic transistor of claim 1, wherein the porous layer is obtained from silane.

8. The organic transistor of claim 1, wherein the porous layer is made of porous silica.

9. The organic transistor of claim 1, wherein the porous layer is made of porous alumina obtained by a sol-gel method.

\* \* \* \* \*